(12) United States Patent
Furukawa et al.

(10) Patent No.: US 7,227,233 B2
(45) Date of Patent: Jun. 5, 2007

(54) SILICON-ON-INSULATOR (SOI) READ ONLY MEMORY (ROM) ARRAY AND METHOD OF MAKING A SOI ROM

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 11/162,472

(22) Filed: Sep. 12, 2005

(65) Prior Publication Data

US 2007/0057323 A1    Mar. 15, 2007

(51) Int. Cl.
*H01L 29/76* (2006.01)
*H01L 29/94* (2006.01)
*H01L 31/00* (2006.01)

(52) U.S. Cl. .............................. 257/390; 257/E27.102; 257/E21.662; 257/E21.671

(58) Field of Classification Search ................ 257/390, 257/E27.102, E21.662, E21.671
See application file for complete search history.

(56) References Cited

U.S. PATENT DOCUMENTS

| | | | |
|---|---|---|---|
| 5,627,092 A | 5/1997 | Alsmeier et al. | |
| 6,373,753 B1* | 4/2002 | Proebsting | 365/189.09 |
| 6,414,365 B1 | 7/2002 | Letavic et al. | |
| 6,426,252 B1 | 7/2002 | Radens et al. | |
| 6,489,655 B2 | 12/2002 | Doyle et al. | |
| 6,660,568 B1 | 12/2003 | Gaidis | |
| 6,787,383 B2 | 9/2004 | Chidambarro et al. | |
| 6,861,697 B1* | 3/2005 | Violette et al. | 257/315 |

* cited by examiner

*Primary Examiner*—Ngân V. Ngô
(74) *Attorney, Agent, or Firm*—Law Office of Charles W. Peterson, Jr.; William D. Sabo, Esq.

(57) ABSTRACT

A silicon-on-insulator (SOI) Read Only Memory (ROM), and a method of making the SOI ROM. ROM cells are located at the intersections of stripes in the surface SOI layer with orthogonally oriented wires on a conductor layer. Contacts from the wires connect to ROM cell diodes in the upper surface of the stripes. ROM cell personalization is the presence or absence of a diode and/or contact.

15 Claims, 7 Drawing Sheets

SILICON-ON-INSULATOR (SOI) READ ONLY MEMORY (ROM) ARRAY AND METHOD OF MAKING A SOI ROM

BACKGROUND OF THE INVENTION

1. Field of the Invention

The present invention is related to nonvolatile storage and more particularly to integrated circuit chips including nonvolatile storage such as one or more cells or an array of nonvolatile random access memory (NVRAM) cells.

2. Background Description

Semiconductor memories made in well known complementary, insulated-gate Field Effect Transistor (FET) technology, commonly referred to as CMOS, are well known in the art. A typical semiconductor memory is an array of memory cells arranged in rows and columns. Each cell is addressed by coincidence of a row with a column. When each row is selected, e.g., driving a word line, cells in the row are connected to the respective column or bit lines. So, cells may be accessed by selecting a row, and checking for a signal response on one or more columns.

In what is well known as a Read Only Memory (ROM), each ROM cell has fixed contents that may not be changed. A typical ROM cell, for example, is a transistor (FET) or a diode. ROM cells are personalized by either the presence or absence of a transistor or diode in each cell, or a connection to a cell transistor or diode. Before even low level integration, for example, ROMs routinely were assembled of an array of discrete diodes by selectively wiring together the anodes of selected diodes in a row, and wiring together the cathodes of diodes in each column.

More recently, however, circuit structures in semiconductor Integrated Circuits (ICs) are normally formed on the surface of a semiconductor substrate or, for Silicon-on-insulator (SOI), on the surface of a semiconductor (silicon) layer. Diodes have not proven very efficient for SOI ROM cells. Discrete diodes are impractical in bulk silicon because active devices, including diodes, share the bulk substrate in common, i.e., transistor collectors/FET substrates are in the same shared diode terminal (anode/cathode). Further for addressability, SOI diode ROM cells typically require FETs that consume additional space.

A typical SOI diode has contacts to both the anode and cathode on the same surface of a silicon surface layer. Several diodes may be formed in the surface layer, which acts as a shared common anode or cathode for the diodes, e.g., spaced in a silicon surface layer strip at sufficient distance to isolate them from each other. Consequently, a contact to that shared terminal (silicon surface layer anode/cathode), e.g., at one end or the other or the middle of the silicon strip, is invariably closer to some diodes than to others.

For a typical state of the art thin silicon surface layer, the sheet resistance ($\rho$) may be greater than one thousand ohms per square (1 K$\Omega$/). So, even before adding diode junctions, which act to increase $\rho$ in the vicinity of each diffusion, the resistance of such a strip may be tens of K$\Omega$. This resistance further increases as the line width for the strip narrows (for density) and/or the strip is lengthened (for increased capacity). Moreover, when the maximum available voltage is limited (currently to approximately 1 Volt), the voltage dropped by diode current flowing through this resistance can absorb a large percentage of the available signal. Conventional saliciding of the silcon strip to reduce resistance tends to short the surface electrodes together, frustrating individual diode formation. Consequently, a ROM designer is faced with either using wider, unsalicided strips of diodes for a much less denser array or, accepting signal loss from high resistance in return for density.

Thus, there is a need for a dense SOI ROM and, more particularly dense SOI ROM arrays on minimum pitch in both row and column directions.

SUMMARY OF THE INVENTION

It is a purpose of the invention to improve Read Only Memory (ROM) array density;

It is another purpose of the invention to increase ROM density in Silicon-on-insulator (SOI) Integrated Circuits (ICs) while minimizing ROM cell signal loss;

It is yet another purpose of the invention to increase SOI IC on-chip ROM density to minimum line pitch for surface silicon layer lines without significantly complicating chip manufacturing.

The present invention relates to a Silicon-on-insulator (SOI) Read Only Memory (ROM) and a method of making the SOI ROM. ROM cells are located at the intersections of stripes in the surface SOI layer with orthogonally oriented wires on a conductor layer. Contacts from the wires connect to ROM cell diodes in the upper surface of the stripes. ROM cell personalization is the presence or absence of a diode and/or contact.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
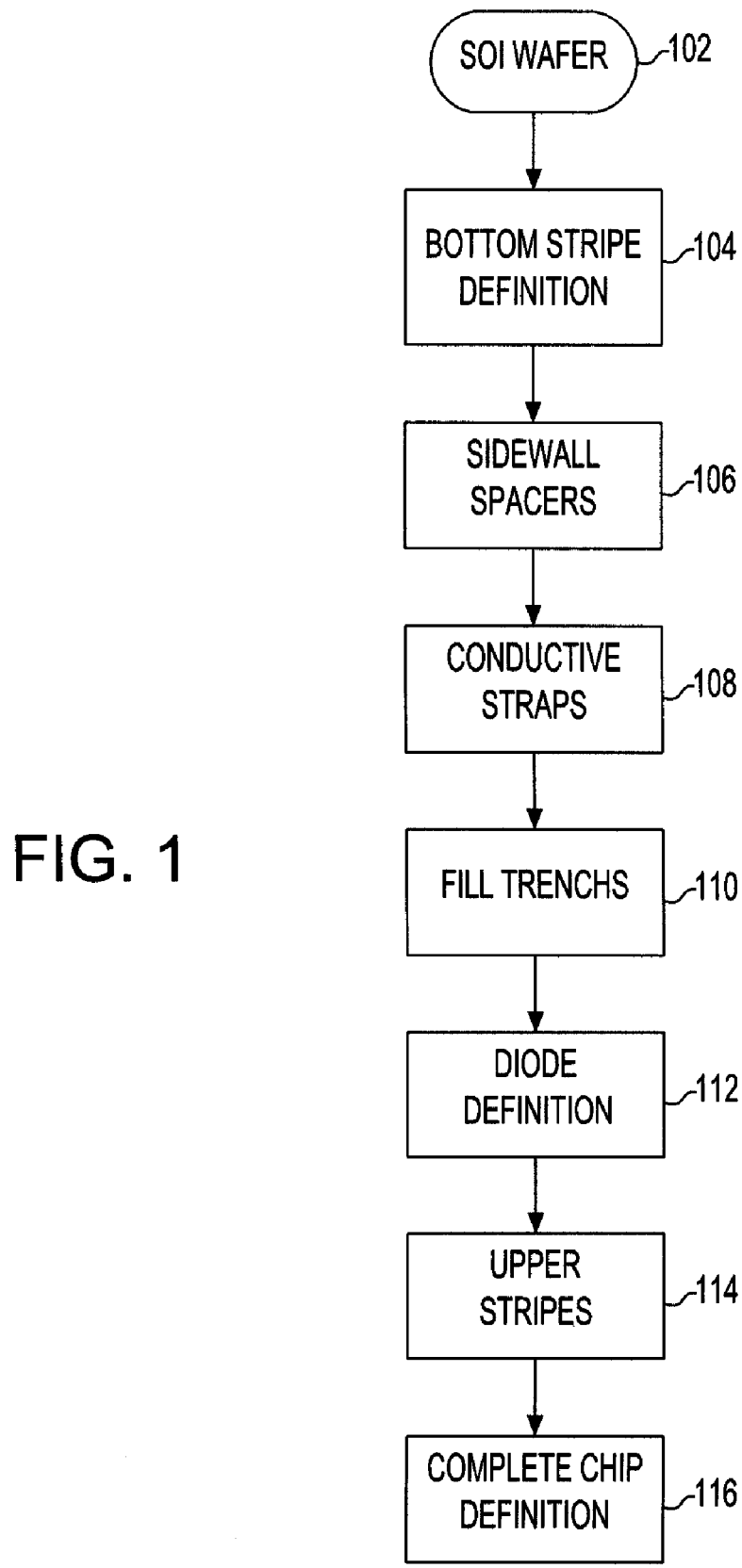
FIG. 1 shows a flow diagram example of steps in forming an array of Read Only Memory (ROM) cells, e.g., a cross point ROM array, according to a preferred embodiment of the present invention.

Turning now to the drawings more particularly FIG. 1 shows a flow diagram example of steps in forming an array of Read Only Memory (ROM) cells, e.g., a cross point ROM array, according to a preferred embodiment of the present invention. Preferably, the array is formed in a standard Silicon-on-insulator (SOI) wafer 102, and includes a pair of layers of orthogonal conductive lines with each cell selectively including a diode and connection to lines in the orthogonal layers. The diodes are vertical diodes all oriented in the same direction, e.g., each with its cathode at a conductive line in the first layer (e.g., the silicon surface layer) and its anode selectively connected to a conductive line in the other layer, e.g., an overlying wiring layer. Thus, for example, by placing a voltage on a line in the upper conductive layer, a voltage sufficient to bias connected diodes above the turn-on (~0.7 V), diodes connected to the line turn on and conduct. The conducting diodes pass current and raise respective silicon surface layer lines to one diode drop below the applied voltage, i.e., an on voltage. Any silicon surface layer lines without connected diodes (i.e., missing diodes or missing connections from the upper layer conductive lines) do not conduct current and remain at an unselected or, low voltage. Thus, cell contents may be sensed by sensing current or lack thereof through a cell or, by a corresponding voltage change.

Each ROM cell is very compact. Cell size is limited only by the minimum pitch of each of the two orthogonal layers. Preferably, the array is formed substantially coincident with forming circuit devices with additional steps or step variations at appropriate points in device definition and wiring.

So, beginning in step 104, lines are formed in one direction in a first conductive layer. For example, the lines may be formed by defining stripes in the surface silicon layer of the SOI wafer, e.g., using standard Shallow Trench Isolation (STI). Optionally, in step 106, protective spacers are formed along exposed stripe sidewalls. Then, conductive straps are formed in step 108 under the edges of the stripes. In step 110 the trenches are filled with dielectric to isolate the stripes and the wafer is planarized. In step 112, diodes are formed at cell locations, e.g., by diffusions formed in the upper surface of the stripes with device source/drain definition. A dielectric layer is formed on the stripes and contacts are electively opened above each diode. Each cell may be programmed by selectively including/omitting a diode and/or contact to the diode. Also, the diode diffusions may be formed with the contacts. Thereafter, upper stripes are formed in step 114 oriented orthogonally to the lower stripes, and selectively contacting diodes. Finally, in step 116, chip definition is completed, e.g., connecting individual ROM circuits together and the ROM array to chip circuits and through typical Back End of the Line (BEOL) semiconductor wafer fabrication.

So, array formation may begin in step 104, for example, by forming protective pad layer (e.g., nitride) on surface silicon layer of the SOI wafer. The pad layer may be patterned with the stripe pattern. Then, with the patterned pad layer as a mask and using a standard STI formation, trenches are etched through the silicon surface layer during a device definition step. For example, trenches may be defined etching through the silicon surface layer to and slightly into an underlying dielectric layer, e.g., a Buried OXide (BOX) layer. Optional protective sidewall spacers may be formed in step 106, e.g., by depositing a conformal nitride layer and anisotropically etching the conformal nitride layer to re-expose the BOX layer in the trenches.

Buried conductive straps may be formed on either or both sides of each stripe to reduce the stripe resistance in step 108. Strap formation begins, for example, by opening cavities along the sides of each stripe by isotropically etching the exposed BOX layer in the trenches, to etch under the sides of the stripes. Then, the cavities are filled with conductive material, e.g., heavily doped polysilicon, tungsten (W), tungsten silicide ($WSi_2$), or any other suitable conductive material. The cavity fill may be accomplished by forming a conformal layer of the conductive material, and isotropically etching to remove excess conductive material, i.e., the entire conformal layer except in the cavities. In step 110 the protective sidewall spacers are removed, if included, and the trenches are filled with dielectric to isolate the stripes from each other. Thereafter, the wafer is planarized, e.g., using a typical chemical-mechanical polish (chem-mech polish (CMP)) to planarize the wafer back to the nitride surface pad layer. The protective pad layer may be removed before, after, or by the CMP. Optionally, before filling the cavities with highly conductive material, the lower corners of the stripes may be doped, e.g., from within the cavities, to avoid forming Schottky barrier diodes with the conductive material. So, the lower corners may be doped, for example, by forming a thin conformal surface layer of heavily-doped polysilicon, for example, and diffusing the dopant into underlying stripe edges. When the optional polysilicon layer is removed, the corners are doped and the highly-conductive material forms a resistive contact with the stripe lower corners.

After planarizing and with the pad layer removed, diodes are formed in step 112 at selected cell locations, e.g., in the upper surface of the stripes during or in a similar manner as source/drain definition. So, for example with an N-type surface layer or an N-well formed in the surface layer at the array, P-type diffusion anodes may be formed at selected diode locations with each particular stripe being a common cathode for diodes in that particular stripe. Similarly, with a P-type surface layer or a P-well formed in the surface layer at the array, N-type diffusion cathodes may be formed at diode locations with each stripe being a common anode for diodes in the particular stripe. Thereafter, through-vias or conductive contacts are formed at diodes. Upper stripes, e.g., metal wires, are formed in step 114 oriented orthogonally to the lower stripes, each selectively contacting cell diodes in ones of the lower stripes. Finally, in step 116, chip definition is completed, e.g., connecting individual ROM circuits together, the ROM array to chip circuits and chip circuits to off-chip pads.

Figure 2A:
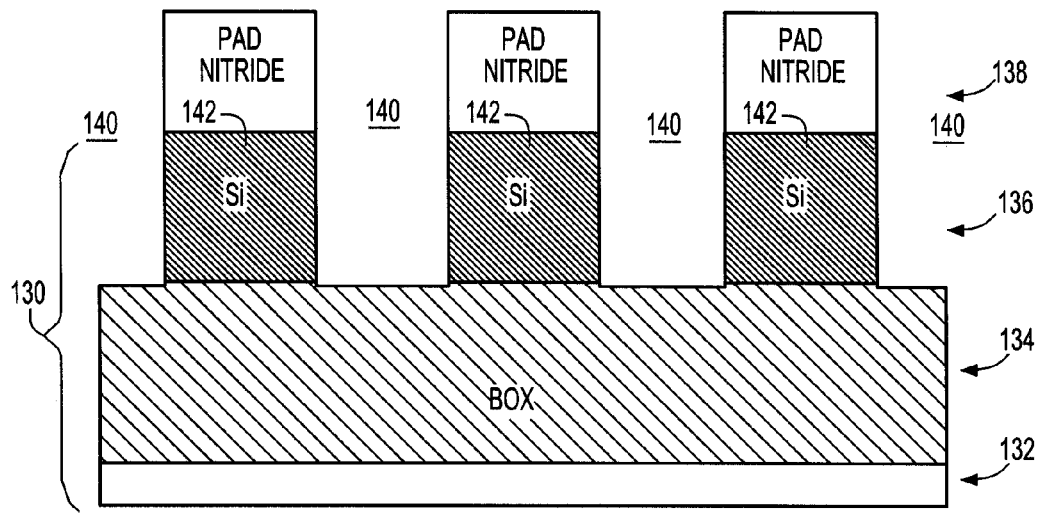
FIGS. 2A–2E show an example of a cross section illustrating diode stripe formation.

FIGS. 2A–E show an example of a cross section of diode stripes formed according to the steps of FIG. 1. Array formation begins in step 102 as shown in FIG. 2A with a typical SOI wafer 130, i.e., a semiconductor substrate layer 132 supporting an insulator (e.g., BOX) layer 134 beneath a semiconductor (e.g., silicon) surface layer 136. Stripe formation begins in step 104 by forming a pad nitride layer 138 on the surface silicon layer 136 and patterning the pad nitride layer 138, e.g., using typical photolithography patterning techniques. With the patterned pad nitride layer 138 acting as a mask for the surface silicon layer 136, exposed portions of the silicon surface layer 136 are etched away to form shallow trenches 140 through the silicon surface layer 136 and slightly into the insulator 134. This etch defines stripes 142.

Figure 2B:
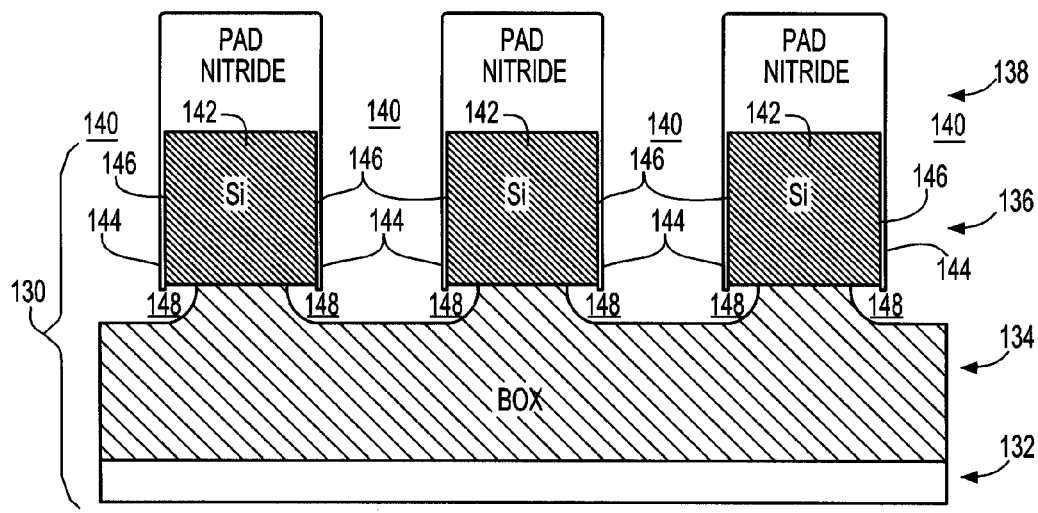

In step 106 as shown in FIG. 2B protective spacers 144 are formed along the sidewalls 146 of the silicon stripes 142. Non-array circuit areas (not shown in this figure) may be masked with a protective mask to prevent unintentionally strapping (and thereby, shorting out) FET channels in those non-array areas. While the protective spacers may be of the same material as the pad layer 138, i.e., nitride, subsequently removing the nitride spacers 144 removes part of the pad layer 138 as well. Since the sidewall spacers 144 are removed prior to filling the trenches 140 with dielectric for STI, germanium (Ge) protective spacers 144, which are of a different material than the pad layer 138, may be preferable. Once the sidewalls 146 are protected, the exposed dielectric layer 134 is isotropically etched in the trenches 140, e.g., using a suitable wet etch, to undercut the silicon stripes 142 forming cavities 148 along the perimeters of stripes 142. Preferably, the cavities 148 undercut the stripes 142 in this example by no more than a quarter of the stripe width.

Figure 2C:
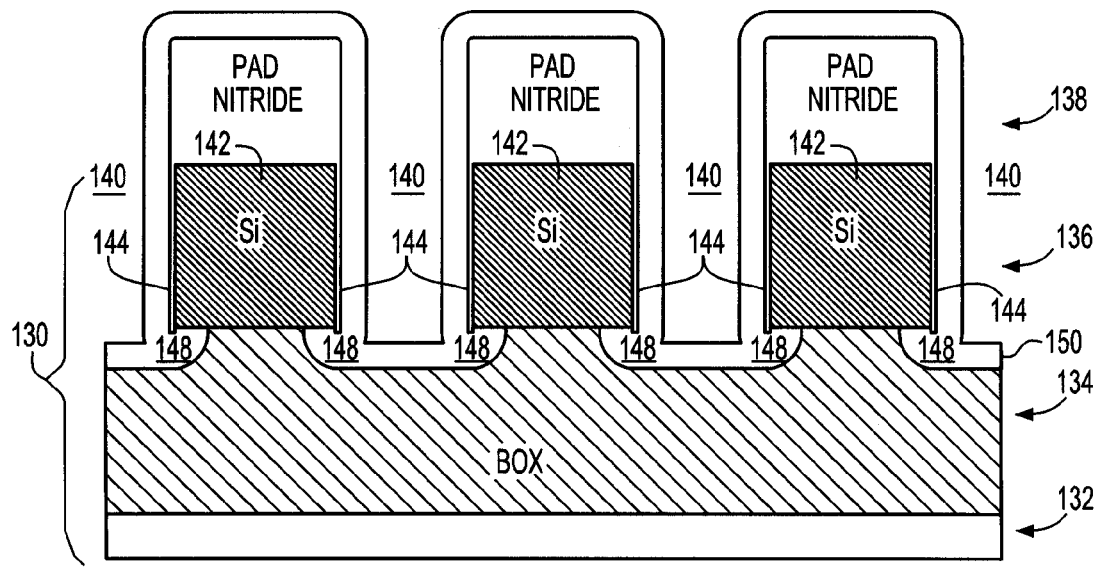

Step 108 begins in FIG. 2C by forming a conformal layer 150 of highly-conductive material (e.g., $WSi_2$) on the wafer 130, such that the highly conductive material fills the cavities 148. Optionally, the lower corners of the stripes 142 may be doped, e.g., from within the cavities 148, to insure good resistive contacts (and avoid forming Schottky barrier diodes), prior to filling the cavities 148 with conductive material. In this optional step, a thin conformal layer of heavily-doped polysilicon, for example, may be formed on the wafer, and for example, using a rapid thermal anneal (RTA) the dopant transfers (diffuses) from the doped polysilicon to underlying stripe edges. Then, the optional polysilicon layer is removed, and the conformal highly-conductive layer 150 is deposited.

Figure 2D:
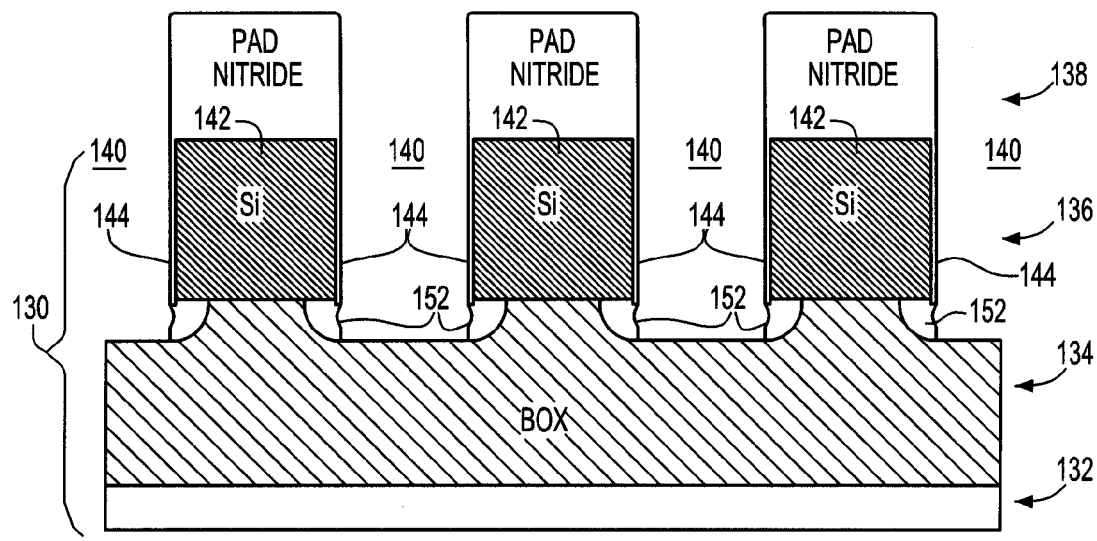

In FIG. 2D, the highly conductive layer 150 is etched until only highly conductive straps 152 remain, filling the cavities and strapping the undersides of the stripes 142. A directional etch may be used for better control of highly conductive material (metal) removal, provided an extended etch to remove the sidewalls spacers is acceptable. Alternately, excess metal may be removed with an isotropic etch, taking care that the cavities remain completely filled, and provided that some over-etch is tolerable and doesn't unacceptably reduce metal volume for the straps 152.

Figure 2E:
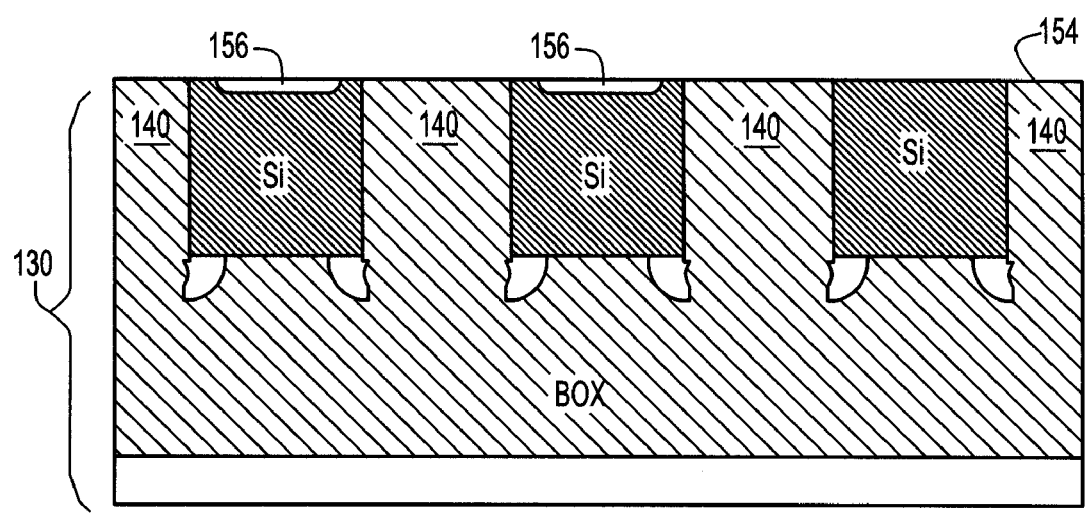

In Step 110 as shown in FIG. 2E, the shallow trenches 140 are filled with insulating material, e.g., oxide. However, prior to filling the trenches 140, spacers 144 may be removed. Germanium sidewall spacers 144, in particular, may be removed by etching selectively to SOI, nitride, and underlying $SiO_2$ with hydrogen peroxide ($H_2O_2$). However, temperatures must be kept relatively low, while the Ge sidewall spacers 144 are removed. After filling the shallow trenches 140 with insulating material, the wafer is planarized approximately to the upper surface 154 of the silicon stripes 142 and the nitride pad layer 138 is stripped away.

Personalization step 112 completes cell formation. Diodes are formed in cell locations by selectively forming diffusions 156 of a type opposite the stripes 142. In particular, the diffusions 156 may be formed simultaneously with circuit device source/drain diffusions or with subsequent contact formation. If non-array devices are salicided for reduced device resistances, the stripes 142 are protected (e.g., masked), so that salicide does not form on them. An inter-level dielectric layer (not shown) is formed on the planarized surface 154 and conductive contacts or through-vias (also not shown) are formed to the diode diffusions 156 through the interlevel dielectric layer, connecting wires in the second, conductive line layer. Optionally, diffusions also may be formed into the exposed backside regions.

Figure 3:
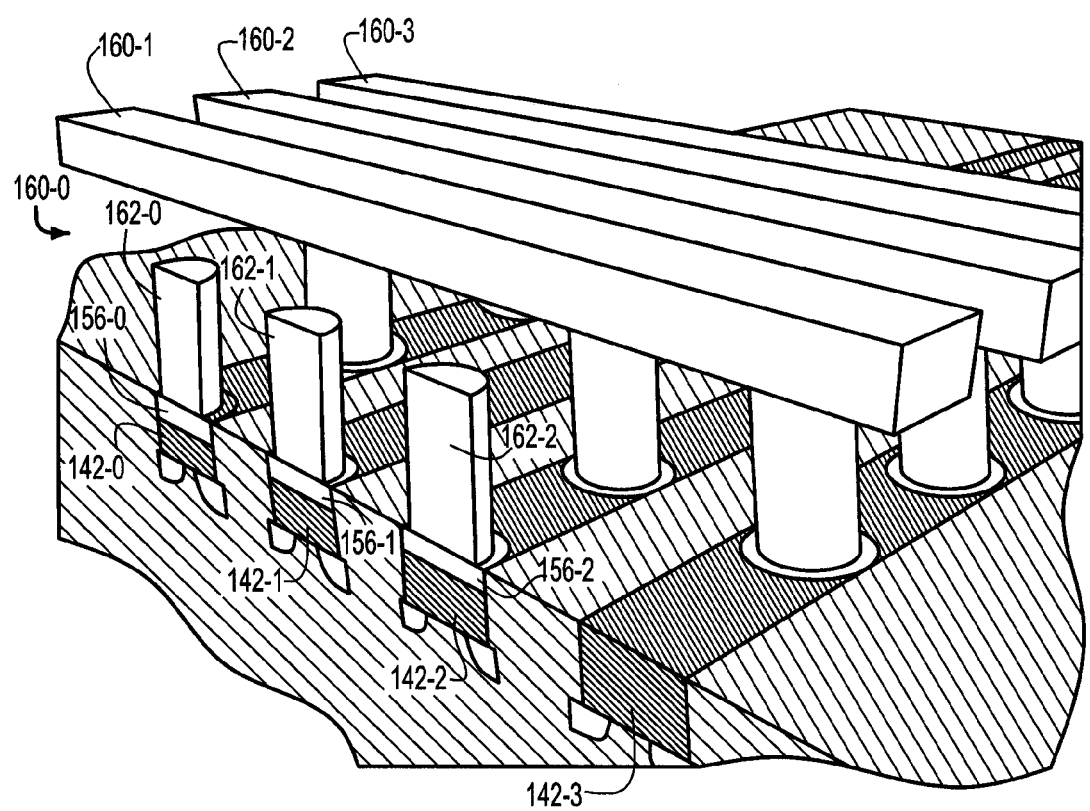
FIG. 3 shows a three-dimensional (3D) cut-away example of a 4×4 array of ROM cells.

FIG. 3 shows a three-dimensional (3D) cut-away example of a 4×4 array of ROM cells with stripes 142-0, 142-1, 142-2, 142-3, formed as described for FIGS. 2A–F. In this example the stripes 142-0, 142-1, 142-2, 142-3, are formed in a column direction, with conductive lines orthogonally oriented in a second layer and forming rows 160-1, 160-2, 160-3. In one row 160-0, the conductive line is omitted for illustration and the cut-away is taken through cells in that row 160-0. Thus, each cell is formed at an intersection of column 142-0, 142-1, 142-2, 142-3, with a row 160-0, 160-1, 160-2, 160-3. So, diffusions (e.g., 156-0, 156-1, 156-2) and contacts (e.g., 162-0, 162-1, 162-2) in each row, 160-0, 160-1, 160-2, 160-3 determine cell contents. For example, including a diode and contact may be designated as a "1" in a corresponding cell and lack thereof as a "0" or vice versa. Optionally for simpler personalization, diffusions may be included in each cell, with cell contents determined solely by inclusion/omission of contacts, e.g., 162-0, 162-1, 162-2.

Thus, omission of a contact and diffusion, in this example, a logical zero and inclusion of a contact and diffusion indicates a logic one. So, for this example, the array is discharged between accesses by holding all rows 160-1, 160-2, 160-3 low and discharging all column lines 142-0, 142-1, 142-2, 142-3. Access begins by raising a single row line, e.g., 160-2, to a select voltage, e.g., 1.0 V, current flows wherever a contact and diode exists. So, wherever a contact and diode exists, the corresponding connected column line 142-0, 142-1, 142-2, 142-3 is pulled up, e.g., ignoring resistance and for an on-diode voltage of 0.7 V, to 0.3 V (300 mV). Other unconnected columns remain low. The straps reduce stripe resistance by a factor of 3 or 4 or more. So, where resistance losses might have accounted for 100 mV of this 300 mV signal, resistance loss for a preferred embodiment stripe is, perhaps 25–35 mV or less. So, current flowing through a diode even at the one end of a stripe, has a good, conductive, low-resistance signal path to sensing circuits at the other end of the stripe. Thus, instead of losing signal in a highly-resistive stripe (i.e., from the high sheet resistance of the surface layer) and further capacitive delay from the signal passing along a highly-resistive line, the conductive cavities significantly improve signal margin by reducing signal loss and delay.

Figure 4:
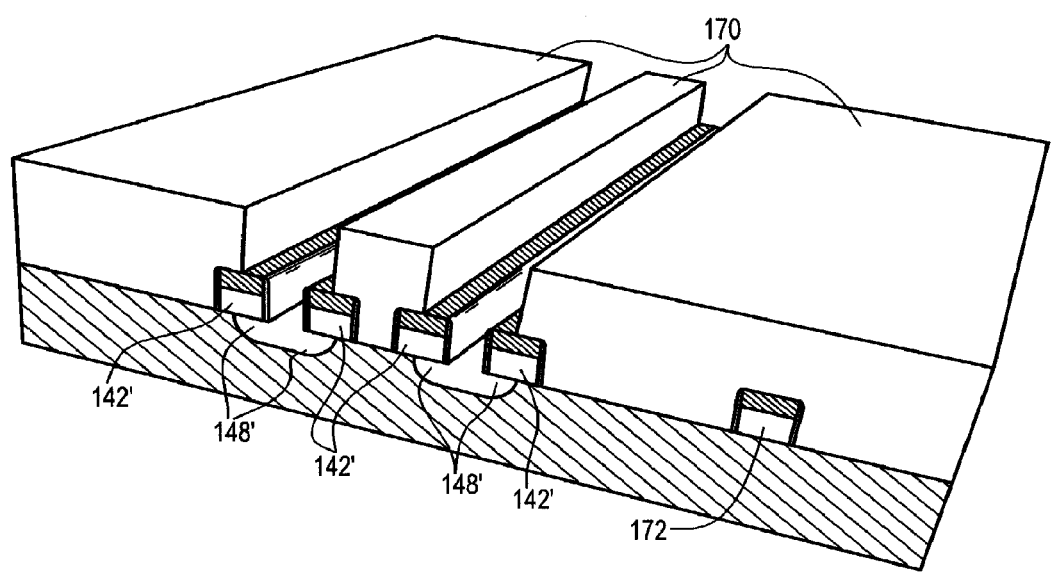
FIG. 4 shows an example of alternative embodiment of stripe formation wherein straps are formed from only one side of each stripe.

FIG. 4 shows an example of alternative embodiment of stripe formation wherein a photoresist block-out mask 170 (e.g., applied in step 108 of FIG. 1 to protect support surface layer structures 172 that are not part of the array) selectively protects alternate array trenches. The array stripes 142' are formed substantially as described for the embodiment of FIG. 2A. However, the cavities 148' formed beneath the array stripes 142' only undercut on one side with trenches on the opposing side being blocked out such that cavities cannot form. Advantageously, the cavities 148' extend farther under the stripes 142' in this alternate embodiment and beyond the mid point to undercut the stripes by as much as ⅔ of the stripe width. The larger single cavity 148' of this embodiment affords a higher volume of highly-conductive material for still lower stripe resistance. Thus, for this embodiment with stripe resistance reduced, performance and signal are further improved for the same stripe length, or alternately, stripe length may be increased without performance or signal loss. Once the cavities 148' are formed, processing continues as for the example of FIG. 2C.

Figure 5A:
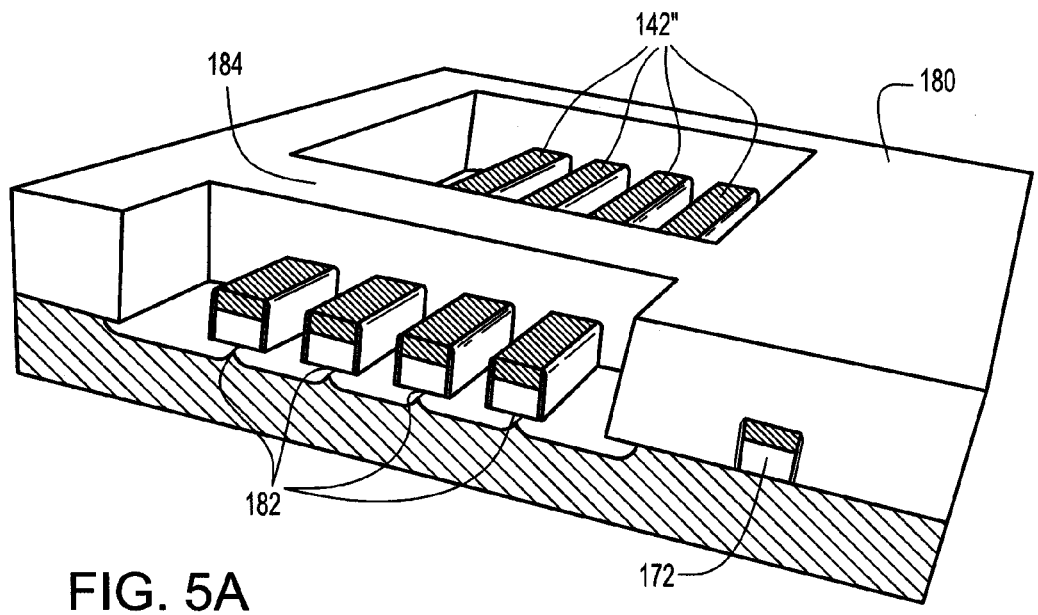
FIGS. 5A–5B show yet another example of an alternate embodiment, wherein cavities completely undercut the stripes except for brief interruptions that tack each stripe in place.
Figure 5B:
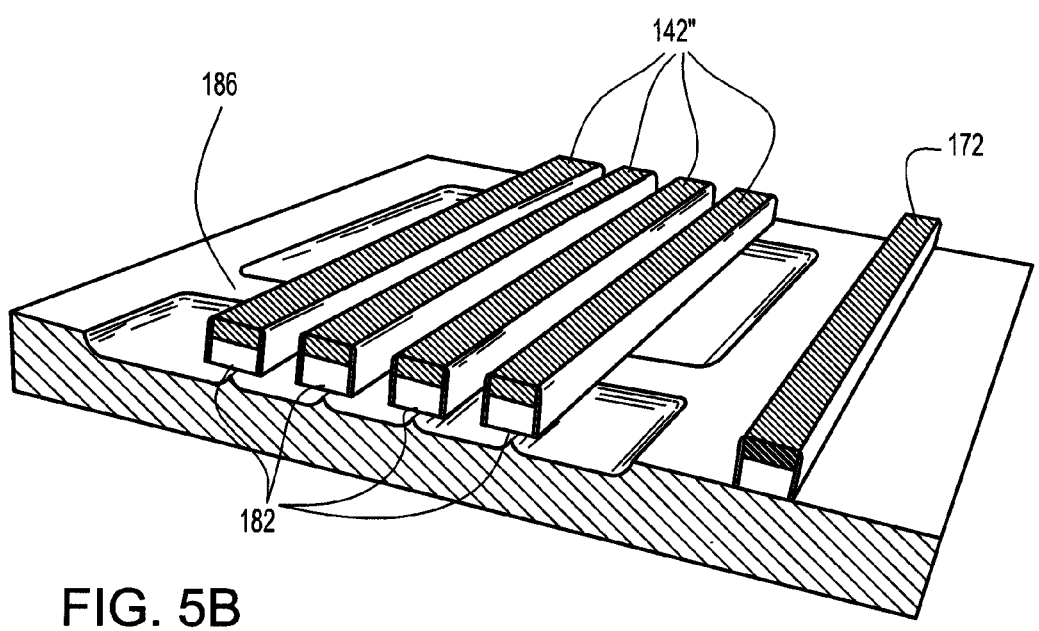

FIGS. 5A–B show yet another example of an alternate embodiment, both with the periphery protective mask 180 in place and removed, respectively. In this example, segmented cavities 182 completely undercut the stripes 142" except for brief interruptions 184, 186 between segments that tack each stripe 142" in place, such that a segmented strap forms in each undercut (cavity 182) under each stripe 142". At the sub-micron dimensions of the stripes 142", such an untethered stripe 142" can warp, twist or bow in nearly any direction depending on ambient, structural and environment forces. So, the interruptions 180 serve to tack and hold the stripes 142" in place. So, when the conductive material layer is deposited to fill the cavities 182, each segmented strap that forms lines the bottom of each of the stripes 142"; except between segments as defined by the periphery protective mask 180 which covers the stripes 142" at the interruptions 184, 186. Once filled, the straps also serve to tack the respective stripe 142" in place. However, the deeper undercuts 182, can hold even more metal than the embodiments of FIGS. 2A–E, 3 and 4, and so, provide even lower line resistance and better performance. This embodiment is especially well suited for small arrays of short stripes with interruptions 186 at either end, where line distortion is not expected to occur between interruptions 186, e.g., from sagging or bowing.

Optionally, since the straps also serve to tack the respective stripe 142" in place, a continuous full length strap may be formed of this embodiment in a two step variation. After filling the undercuts 182 with metal, strapped portions of the stripes 142" may be masked and the BOX layer may be removed in the interruptions 186. The BOX layer may be removed in the interruptions 186, e.g., by wet etching to undercut the interruptions 186, and depositing highly-conductive material to fill the new undercut cavities at interruptions 186. During this second step, the previously filled undercut cavities 182 hold the stripes 142" in place. Thus, this optional second fill forms unbroken straps along the underside along the entire length of the stripes, while only adding one additional masking, filling and etching step.

Advantageously, a preferred embodiment ROM may be formed on minimum pitch in both directions and without significant signal loss from silicon stripe resistance. Further, a preferred embodiment ROM array may be formed on any SOI wafer and as part of any integrated circuit, using typical state of the art device definition and chip manufacturing techniques.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A Read Only Memory (ROM) array comprising:
   a plurality of semiconductor lines oriented in a first direction;
   a strap along at least one edge of each semiconductor line;
   a plurality of conductive lines in a second direction orthogonal to said first direction;
   a plurality of diodes in said plurality of semiconductor lines, each located at the intersection of one of said plurality of conductive lines with one of said plurality of semiconductor lines; and
   a plurality of contacts, each connected between one of said plurality of conductive lines and an underlying one of said plurality of diodes.

2. A ROM array as in claim 1, wherein said strap extends from said one edge under said each semiconductor line by at least half the width of said each semiconductor line.

3. A ROM array as in claim 1, wherein one said strap is disposed under opposite edges of said each semiconductor line.

4. A ROM array as in claim 1, wherein each said strap is a segmented strap, each strap segment extending under the entire width of said each semiconductor line.

5. A ROM array as in claim 1, wherein said strap comprises a material including tungsten.

6. A ROM array as in claim 5, wherein said strap material is tungsten silicide.

7. A ROM array as in claim 1, wherein each said intersection locates a ROM cell, the presence of a contact in any said ROM cell being a one and the absence being a zero.

8. A ROM array as in claim 1, wherein said plurality of semiconductor lines are silicon lines in a surface layer of a silicon-on-insulator chip, each doped at said strap such that said strap forms a resistive contact with said each semiconductor line.

9. A silicon-on-insulator (SOI) integrated circuit (IC) chip, said SOI IC including a Read Only Memory (ROM) comprising:
   a plurality of silicon lines in a first direction in a silicon surface layer of an SOI chip;
   a strap along at least one edge of each silicon line;
   a plurality of conductive lines in a second direction orthogonal to said first direction, a ROM cell being located at each intersection of one of said plurality of conductive lines with one of said plurality of silicon lines;
   a plurality of diodes in said plurality of lines, each located in a corresponding ROM cell; and
   a plurality of contacts, each connected between one of said plurality of conductive lines and an underlying one of said plurality of diodes, wherein the presence of a contact in any said ROM cell is a first logic state and the absence being a second logic state.

10. A SOI IC as in claim 9, wherein said strap extends from said one edge under said each silicon line by at least half the width of said each silicon line.

11. A SOI IC as in claim 9, wherein one said strap is disposed under opposite edges of said each silicon line.

12. A SOI IC as in claim 9, wherein each said strap is a segmented strap, each strap segment extending under the entire width of said each silicon line.

13. A SOI IC as in claim 9, wherein said strap comprises a material including tungsten.

14. A SOI IC as in claim 9, wherein said strap material is tungsten silicide.

15. A SOI IC as in claim 9, wherein said plurality of silicon lines is at least 4 silicon lines and said plurality of conductive lines is at least 4 conductive lines, each doped at said strap such that said strap forms a resistive contact with said each semiconductor line.

* * * * *